(12) United States Patent
Tour et al.

(10) Patent No.: US 8,592,791 B2
(45) Date of Patent: Nov. 26, 2013

(54) ELECTRONIC DEVICES CONTAINING SWITCHABLY CONDUCTIVE SILICON OXIDES AS A SWITCHING ELEMENT AND METHODS FOR PRODUCTION AND USE THEREOF

(75) Inventors: James M. Tour, Bellaire, TX (US); Jun Yao, Houston, TX (US); Douglas Natelson, Houston, TX (US); Lin Zhong, Houston, TX (US); Tao He, Zhongguancun (CN)

(73) Assignee: William Marsh Rice University, Houston, TX (US)

( * ) Notice: Subject to any disclaimer, the term of this patent is extended or adjusted under 35 U.S.C. 154(b) by 319 days.

(21) Appl. No.: 12/848,626

(22) Filed: Aug. 2, 2010

(65) Prior Publication Data

US 2011/0038196 A1 Feb. 17, 2011

Related U.S. Application Data

(60) Provisional application No. 61/246,902, filed on Sep. 29, 2009, provisional application No. 61/330,654, filed on May 3, 2010.

(51) Int. Cl.
*H01L 47/00* (2006.01)
(52) U.S. Cl.
USPC ............... 257/3; 257/E45.002; 257/E21.003; 365/148; 365/163
(58) Field of Classification Search
USPC ............................. 257/3, E45.002, E21.003
See application file for complete search history.

(56) References Cited

U.S. PATENT DOCUMENTS 5,216,262 A * 6/1993 Tsu ................................ 257/17

OTHER PUBLICATIONS

Simmons, et al., "New Conduction and Reversible Memory Phenomena in Thin Insulating Films", Proc. Royal Soc. Lond. A, 301:1967, pp. 77-102.
Yao, et al., "Resistive Switching in Nanogap Systems on SiO2 Substrates", Small, 5:2009, pp. 2910-2915.
Dearnaley, et al., "A model for filament growth and switching in amorphous oxide films", J. Non-Cryst. Solids, 4:1970, pp. 593-612.
Dearnaley, et al., "Electrical phenomena in amorphous oxide films", Rep. Prog. Phys., 33:1970, pp. 1129-1191.
Yao, et al., "Etching-dependent reproducible memory switching in vertical SiO2 structures", Appl. Phys. Lett., 93:2008, p. 253101 (3 pages).

* cited by examiner

*Primary Examiner* — Long Pham
(74) *Attorney, Agent, or Firm* — Winstead PC

(57) ABSTRACT

In various embodiments, electronic devices containing switchably conductive silicon oxide as a switching element are described herein. The electronic devices are two-terminal devices containing a first electrical contact and a second electrical contact in which at least one of the first electrical contact or the second electrical contact is deposed on a substrate to define a gap region therebetween. A switching layer containing a switchably conductive silicon oxide resides in the gap region between the first electrical contact and the second electrical contact. The electronic devices exhibit hysteretic current versus voltage properties, enabling their use in switching and memory applications. Methods for configuring, operating and constructing the electronic devices are also presented herein.

34 Claims, 13 Drawing Sheets

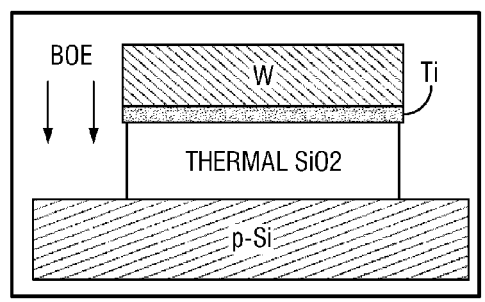
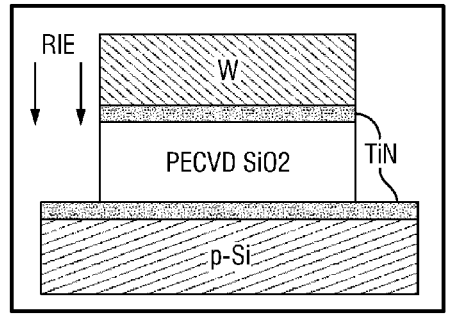
FIG. 11A  FIG. 11B
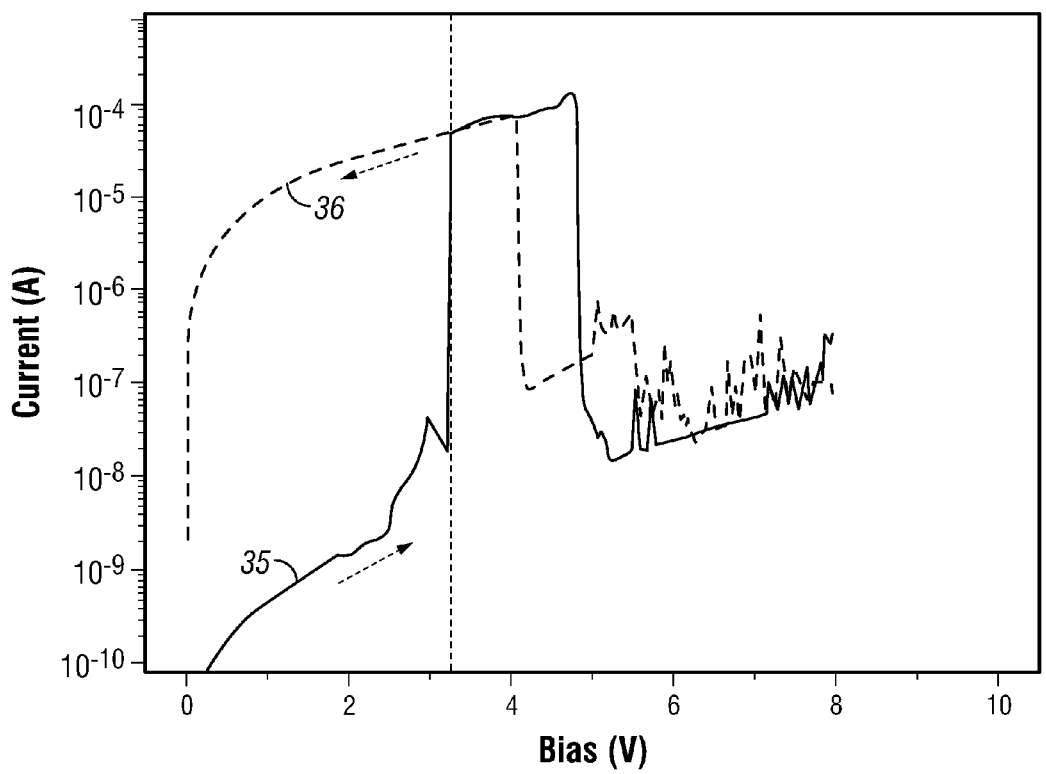
FIG. 12

ELECTRONIC DEVICES CONTAINING SWITCHABLY CONDUCTIVE SILICON OXIDES AS A SWITCHING ELEMENT AND METHODS FOR PRODUCTION AND USE THEREOF

CROSS-REFERENCE TO RELATED APPLICATIONS

This application claims priority to U.S. Provisional Patent Applications 61/230,547, filed Jul. 31, 2009; 61/246,902, filed Sep. 29, 2009; and 61/330,654 filed May 3, 2010, each of which is incorporated by reference in its entirety herein.

STATEMENT REGARDING FEDERALLY SPONSORED RESEARCH

This invention was made with Government support under grant number CNS-0720825, awarded by the National Science Foundation, grant number DE-FC-36-05-G015073, awarded by the Department of Energy, grant number DE-AC05-000R22725, awarded by the Department of Energy, grant number W911NF-08-C-0019, awarded by the Department of Defense, and grant number W911NF-08-C-0133, awarded by the Department of Defense. The Government has certain rights in the invention.

BACKGROUND

Transistors have long been a bulwark of modem electronics due to their extreme reliability, ease of use, and high ON/OFF ratios of $10^4$-$10^5$. Transistors are three-terminal devices that include source, drain, and gate electrode terminals. Two-terminal electronic devices, having only source and drain electrodes, typically have displayed much smaller ON/OFF ratios that have largely precluded their use in electronic switching and memory applications. However, such two-terminal electronic devices can be used in switching and memory applications, provided the devices can be made to display a non-linear current versus voltage response with sufficiently high ON/OFF ratios that are reproducible over operational cycling. In addition, two-terminal devices are desirable in electronics applications, since removal of the gate electrode terminal allows for continued device miniaturization to take place.

For many years, passive two-terminal electronic devices were thought to be limited to resistors, capacitors and inductors. However, based on theoretical considerations, a fourth two-terminal electronic device, a memristor, was proposed, and a nanoscale two-terminal electronic device having memristive properties was discovered in 2008. In macroscale devices, memristive effects are typically minimal. Simply put, a memristor is a passive two-terminal electronic device that continues to "remember" its last resistance state even when there is no bias voltage being applied to the device. On a more fundamental level, a memristor links the magnetic flux to charge. To function as a memristor, a two-terminal electronic device has to display a hysteresis in its current versus voltage profile.

Throughout the history of the semiconductor industry, silicon oxides [including silicon monoxide SiO, silicon dioxide $SiO_2$ and non-stoichiometric silicon oxide $SiO_x$ ($1<x<2$)]] have long been considered to be a passive, insulating component in the construction of electronic devices. However, under appropriate conditions described herein, silicon oxides may become conductive and exhibit a hysteretic current versus voltage response. Such hysteretic behavior makes possible the construction of two-terminal electronic devices containing silicon oxides as a switching component. Such two-terminal electronic devices can be functional as memristors and other memory elements if their ON/OFF ratios can be made sufficiently high.

In view of the foregoing, two-terminal electronic devices containing silicon oxides exhibiting a hysteretic current versus voltage response would be of benefit in the electronics arts. Specifically, such two-terminal electronic devices may have functionality as memristors and other memory elements for switching and memory applications. In addition, two-terminal electronic devices containing silicon oxides are readily compatible with existing semiconductor manufacturing techniques, thereby facilitating their implementation in conventional electronics.

SUMMARY

In various embodiments, electronic devices are described herein. The electronic devices include a first electrical contact and a second electrical contact, a substrate and a switching layer containing a switchably conductive silicon oxide. At least one of the first electrical contact and the second electrical contact is deposed on the substrate, and the first electrical contact and the second electrical contact are arranged so as to define a gap region therebetween. The switching layer resides in the gap region. The electronic device exhibits hysteretic current versus voltage properties. Memory elements, memristors, radiation-hardened articles of manufacture and arrays containing the electronic devices are also disclosed herein.

In some embodiments, methods for operating an electronic device are disclosed herein. The methods include providing an electronic device containing a first electrical contact and second electrical contact, a substrate, and switching layer containing a silicon oxide residing in a gap region between the first electrical contact and the second electrical contact. The methods further include applying an activating voltage to the electronic device to convert the silicon oxide into a switchably conductive state. The activating voltage is part of an electroforming process to convert the silicon oxide into a switchably conductive state. In some embodiments, the switching layer includes at least one vertical edge extending between the first electrical contact and the second electrical contact. In some embodiments, the methods further include programming (e.g., writing or erasing) and reading the electronic devices.

In still other embodiments, methods for making a vertically oriented two-terminal electronic device are described herein. The methods include providing a first conductive layer containing a first electrical conductor, depositing a switching layer on the first conductive layer, and depositing a second conductive layer on the switching layer. The switching layer contains a switchably conductive silicon oxide. In further embodiments, the methods also include etching the second conductive layer and the switching layer to define at least one vertical edge in the switching layer extending between the first conductive layer and the second conductive layer.

The foregoing has outlined rather broadly the features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 11A and 11B present additional schematic illustrations of illustrative vertically oriented electronic devices, along with non-limiting methods for forming them;

FIG. 12 shows an illustrative current versus voltage sweep for a vertically oriented electronic device from 0 to +8 V and then back to 0 V;

DETAILED DESCRIPTION

Figure 1:
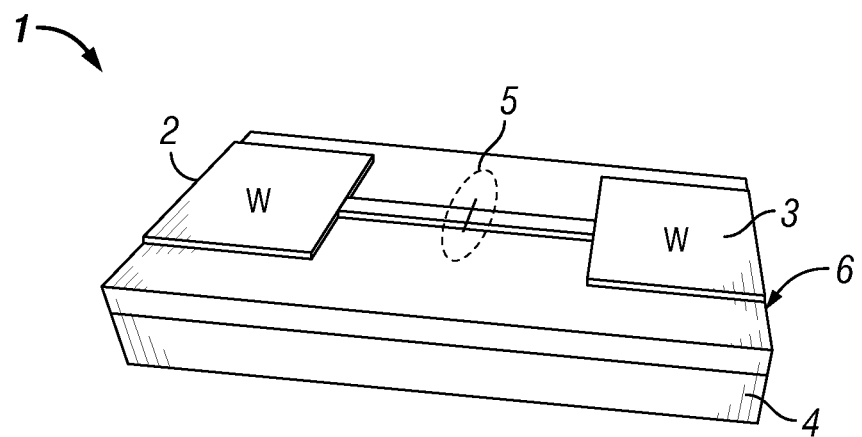
FIG. 1 shows a schematic illustration of an illustrative horizontally oriented electronic device.

In the following description, certain details are set forth such as specific quantities, sizes, etc. so as to provide a thorough understanding of the present embodiments disclosed herein. However, it will be evident to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing particular embodiments of the disclosure and are not intended to be limiting thereto. Drawings are not necessarily to scale.

While most of the terms used herein will be recognizable to those of ordinary skill in the art, it should be understood, however, that when not explicitly defined, terms should be interpreted as adopting a meaning presently accepted by those of ordinary skill in the art. In cases where the construction of a term would render it meaningless or essentially meaningless, the definition should be taken from Webster's Dictionary, 3rd Edition, 2009. Definitions and/or interpretations should not be incorporated from other patent applications, patents, or publications, related or not, unless specifically stated in this specification or if the incorporation is necessary for maintaining validity.

The following definitions are set forth to aid in understanding of the various embodiments of the present disclosure. Terms in addition to those below are defined, as required, throughout the Detailed Description.

"Switchably conductive silicon oxide," as defined herein, refers to, for example, a silicon oxide that exhibits hysteretic current versus voltage behavior after being activated at or above a soft electrical breakdown voltage but below a hard electrical breakdown voltage (i.e., a voltage that results in short circuiting). Due to the hysteretic current versus voltage behavior, electronic devices containing switchably conductive silicon oxide have at least one state that is substantially conductive and at least one OFF state that is substantially non-conductive. Without being bound by any theory or mechanism, Applicants believe that silicon-silicon bonds replace silicon-oxygen bonds in the form of silicon nanocrystals to form a switchably conductive pathway in the parent silicon oxide material.

"Soft electrical breakdown voltage," as defined herein, refers to, for example, a voltage sweep or pulse, including series and combinations thereof, that convert a silicon oxide into a switchably conductive state. As opposed to a "hard electrical breakdown voltage," a soft electrical breakdown voltage does not result in short circuiting of the silicon oxide. Hard electrical breakdown is further distinguished from soft electrical breakdown in that the former produces large changes in resistivity, whereas the latter produces much smaller changes in resistivity. Applying a soft electrical breakdown voltage to a material in order to achieve a switchably conductive state is often referred to as an "electroforming" process.

"Defect-laden $SiO_2$," as defined herein refers to, for example, a switchably conductive, non-stoichiometric silicon oxide that is produced by a treatment of $SiO_2$. "$SiO_x$," as defined herein refers to, for example, a non-stoichiometric silicon oxide having a stoichiometry that is less than that of silicon dioxide ($SiO_2$) but greater than that of silicon monoxide (SiO) (e.g., $1<x<2$). In an alternative embodiment, $SiO_x$ has a stoichiometry less than that of silicon monoxide (SiO) (e.g., $x<1$). As will be evident in view of the written description herein, it will be understood that any of $SiO_2$, doped $SiO_2$, defect-laden $SiO_2$ and $SiO_x$ may be converted into a switchably conductive state, and any embodiments described herein using a particular silicon oxide material may be prepared in a similar manner using another silicon oxide material.

"Hysteretic current versus voltage properties," or, more generally, "hysteresis," refers to, for example, current versus voltage sweeps that do not retrace themselves in the forward and reverse directions "Unipolar switching," as defined herein, refers to, for example, switching between a first conductive state to a second conductive state that depends only on the magnitude of the applied voltage, but not its positive or negative polarity. Bipolar switching, in contrast, takes place between a first conductive state to a second conductive state through an applied voltage that depends on both the voltage's polarity and magnitude. Stated another way, only an applied voltage of sufficient magnitude and a certain polarity is able to switch an electronic device from a first conductive state into a second conductive state in a bipolar switching mechanism.

Silicon oxides, particularly silicon dioxide ($SiO_2$) have long been considered to be a passive, insulating component in the construction of electronic devices. However, in the embodiments presented herein, it is shown that silicon oxides (e.g., $SiO_2$ and $SiO_x$) may serve as the active switching material and electron transport element in electronic devices upon being converted into a switchably conductive state. Without being bound by any theory or mechanism, Applicants believe that application of one or more voltage pulses or sweeps of appropriate magnitude to a silicon oxide-containing electronic device results in formation of a switchably conductive pathway through the generally non-conductive silicon oxide matrix. The one or more high voltage pulses or sweeps are generally at or above a voltage of the soft electrical soft breakdown potential of the silicon oxide but below a voltage where hard breakdown occurs. Applicants believe that application of the voltage pulses or sweeps of appropriate magnitude results in formation of a switchably conductive pathway containing silicon nanocrystals or silicon nanowires within the silicon oxide matrix that supports electron transport between electrode terminals. The switchably conductive pathway can be broken by applying a voltage pulse of sufficient magnitude and then reformed by applying a voltage pulse of lower magnitude. Breaking and reforming the conductive pathway corresponds to erase and write operations, respectively, in a memory device, allowing the electronic devices to operate in distinct OFF and ON states as memory elements and memristors.

In various embodiments, electronic devices disclosed herein include a first electrical contact and a second electrical contact arranged to define a gap region between the two. A switching layer containing a switchably conductive silicon oxide resides in the gap region. At least the first electrical contact is deposed on the substrate. The electronic device exhibits hysteretic current versus voltage properties.

In some embodiments, the switchably conductive silicon oxide is defect-laden $SiO_2$. Such defect-laden $SiO_2$ may be produced from $SiO_2$ residing in the gap region. Production of defect-laden $SiO_2$ may take place in some embodiments by techniques such as, for example, wet-etching or dry-etching, as discussed hereinafter.

In some embodiments, the switchably conductive silicon oxide is a non-stoichiometric silicon oxide $SiO_x$. In some embodiments, $SiO_x$ has a stoichiometry between that of silicon monoxide and silicon dioxide (e.g., x is greater than 1 and less than 2). In more specific embodiments, x ranges between 1.5 and 2. In even more specific embodiments, x ranges between 1.8 and 2 or between 1.9 and 2. In other embodiments, $SiO_x$ has a stoichimetry less than that of silicon monoxide (e.g., x is greater than 0 and less than 1).

In some embodiments, silicon oxide (e.g., $SiO_2$ or $SiO_x$) is directly placed in the gap region during formation of the electronic device before being converted into a switchably conductive state. Direct deposition techniques may include, for example, thermal oxidation of a silicon surface, chemical vapor deposition (CVD—e.g., atmospheric pressure CVD, plasma-enhanced CVD, low pressure CVD, ultra-high vacuum CVD, medium pressure CVD and high pressure CVD), thermal evaporation, sputtering, electron-beam evaporation, molecular beam epitaxy, atomic layer deposition and deposition from solution. In some embodiments, switchably conductive silicon oxide is formed from $SiO_2$ residing in the gap region. In other embodiments, switchably conductive silicon oxide is formed from $SiO_x$ residing in the gap region. In either case, electrically treating the silicon oxide at or above a soft breakdown voltage forms a switchably conductive pathway between the first electrical contact and the second electrical contact. Although defects are introduced in the silicon oxide whether starting from $SiO_2$ or $SiO_x$, the voltage required to reach a switchably conductive state is typically lower when starting from $SiO_x$ as opposed to $SiO_2$.

In addition, in some embodiments, defects may be introduced in the silicon oxide through etching techniques such as, for example, wet-etching and dry-etching. Wet-etching techniques include, for example, buffered oxide etch (BOE), hydrofluoric acid etch (HF etch) and ammonium fluoride etch ($NH_4F$ etch). Dry-etching techniques include, for example, reactive ion etching using gases such as, for example, Ar, $O_2$, $CH_yF_{4-y}$, $Cl_2$, $SF_6$ and $BCl_3$. Both wet- and dry-etching techniques are well known to those of ordinary skill in the art and numerous variations thereof may be undertaken by those of ordinary skill in the art in practicing the various embodiments presented herein.

Again without being bound by theory or mechanism, Applicants believe that the aforementioned wet- or dry-etching techniques introduce defects in the silicon oxide that eventually lead to a switchably conductive state in the electronic devices, as will be described hereinafter. Although etching techniques primarily produce defects at the edge of the switching layer, thereby likely leading to a switchably conductive pathway along the edge, the present electronic devices are by no means limited to edge-based switching. For example, in some embodiments, the silicon oxide may be doped with a variety of dopants to change the conductive properties or to aid in the formation of the switchably conductive state during the electroforming process. In other embodiments, the silicon oxide of the switching layer may be engineered during deposition to contain a conductive pathway therein without the need for electrical treatment above the breakdown voltage. For example, a silicon oxide switching layer may be engineered to contain a switchably conductive silicon nanocrystal conductive pathway therein. In general, dry-etching techniques are generally more aggressive and introduced a greater number of defects along the silicon oxide edges, thereby eventually leading to a conductive state that has a greater number of conductive pathways contained therein. However, one of ordinary skill in the art will recognize that the specific dry etching conditions chosen will influence the etch rate and the stoichiometry produced in the silicon oxide after etching.

In general, electronic devices of the present disclosure are electrically treated by at least one voltage sweep or pulse at or above the soft breakdown voltage in order to form a switchably conductive pathway between the first electrical contact and the second electrical contact Such electrical treatment may also introduce defects in the silicon oxide to produce defects which eventually lead to formation of a conductive pathway therein. As previously described, electrical treatment may be used in combination with wet- and dry-etching techniques to produce such defects.

Figure 2:
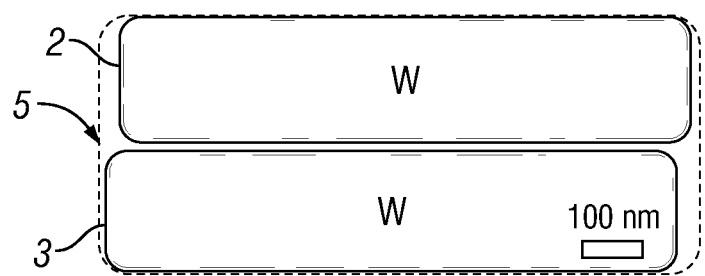
FIG. 2 shows an illustrative SEM image of the gap region in the horizontally oriented electronic device of FIG. 1.

In general, the electronic devices can be constructed in a variety of orientations. In some embodiments, the electronic devices are in a horizontal orientation with the first electrical contact and the second electrical contact spaced apart on a substrate, where the switching layer resides on the substrate between the first electrical contact and the second electrical contact. FIG. 1 shows a schematic illustration of an illustrative horizontally oriented electronic device. As shown in FIG. 1 for horizontally oriented device 1, electrical contacts 2 and 3 are patterned on $SiO_2$ layer 6 of silicon substrate 4 to define a gap region 5 between electrical contacts 2 and 3. In the embodiment shown in FIG. 1, $SiO_2$ layer 6 has a thickness of about 200 nm. The $SiO_2$ in the gap region is subsequently converted into a switchably conductive silicon oxide by any combination of the aforementioned techniques to convert the horizontally oriented electronic device 1 into a switchably conductive state. FIG. 2 shows an illustrative SEM image of gap region 5 in horizontally oriented electronic device 1. In the embodiments shown in FIGS. 1 and 2, electrical contacts 2 and 3 are both made of tungsten. However, other metals as well as non-metallic electrical contacts lie within the spirit and scope of the present disclosure as discussed in more detail hereinafter. Electrical and memory properties and characterizations of the horizontally oriented devices are also discussed in more detail hereinafter.

Figure 3:
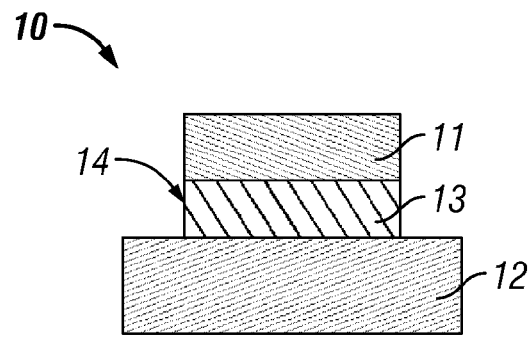
FIG. 3 shows a schematic illustration of an illustrative vertically oriented electronic device.

In some embodiments, the electronic devices are in a vertical orientation with the first electrical contact deposed on substrate and the switching layer residing between the first electrical contact and the second electrical contact. FIG. 3 shows a schematic illustration of an illustrative vertically oriented electronic device 10. As shown in FIG. 3, a silicon oxide layer 13 resides between electrical contacts 11 and 12. One of the electrical contacts lies on a substrate surface or is part of a substrate surface. For example, when the substrate is silicon, the electrical contact 12 is part of the silicon surface. In alternative embodiments, a metal electrical contact may be patterned on a substrate surface to define electrical contact 12 of vertically oriented electronic device 10. In some embodiments, at least one of the first electrical contact and the second electrical contact is a metal such as, for example, platinum, titanium, tungsten, aluminum, copper or mixtures thereof.

In some of the above-described embodiments, at least one of the first electrical contact and the second electrical contact are formed from silicon. Silicon sources may include, for example, single-crystalline silicon, amorphous silicon and polysilicon. In some embodiments, the silicon may further include at least one dopant. In some embodiments, the silicon is p-doped (e.g., boron or aluminum doping). In other embodiments, the silicon is n-doped (e.g., phosphorus, arsenic or antimony doping). In some of the above-described embodiments, both the first electrical contact and the second electrical contact include silicon. For example, in some embodiments, the first electrical contact may be silicon in contact with a silicon substrate and the second electrical contact may be silicon deposited on top of a switchably conductive silicon oxide switching layer. Any combination of metallic, metal alloy, and non-metallic electrical contacts (e.g., silicon) lie within the spirit and scope of the present disclosure. Electrical and memory properties and characterizations of the vertically oriented devices containing both metallic and non-metallic electrical contacts are discussed in more detail hereinafter.

Figure 4:
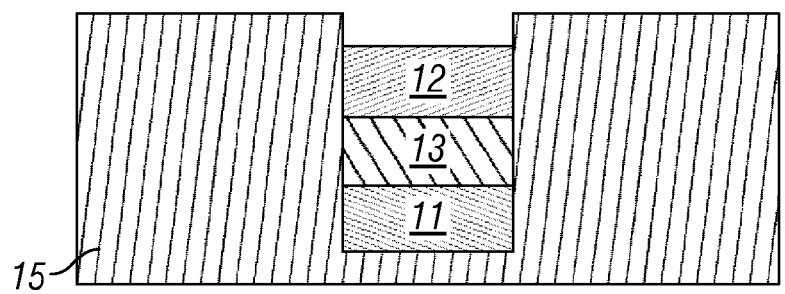
FIG. 4 shows a schematic illustration of an illustrative vertically oriented electronic device fabricated in a hole on a substrate.

In other alternative embodiments, vertically oriented electronic devices may be fabricated in a hole within a substrate such that the first electrical contact, the second electrical contact and the switching layer are deposed in the hole with the switching layer residing between the first electrical contact and the second electrical contact. FIG. 4 shows a schematic illustration of a vertically oriented electronic device fabricated in a hole on a substrate 15. Vertically oriented electronic devices constructed in holes may be used in the construction of vias. Such vias are described in U.S. patent application Ser. No. 12/435,661, the disclosure of which is incorporated herein by reference.

Figure 5:
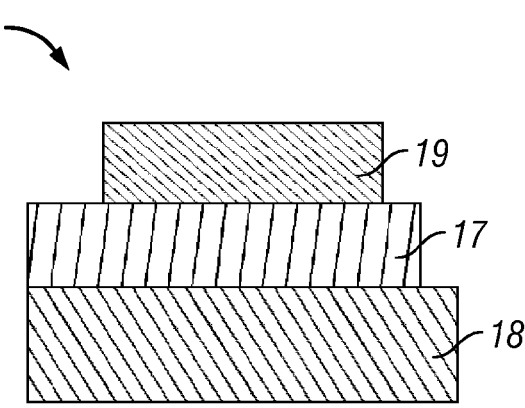
FIG. 5 shows a schematic illustration of an illustrative vertically oriented electronic device lacking a vertical edge.

In some embodiments of the electronic devices, the switching layer has at least one vertical edge extending between the first electrical contact and the second electrical contact. The position of a vertical edge 14 is shown in FIG. 3. FIG. 5 shows a schematic illustration of an illustrative vertically oriented electronic device 16 lacking a vertical edge. Such vertically oriented electronic devices without a vertical edge have a silicon oxide layer 17 deposited on bottom electrical contact 18 that is larger in every aspect than the top electrical contact 19. In other words, the top electrical contact 19 is completely surrounded by the silicon oxide layer 17.

Figure 6:
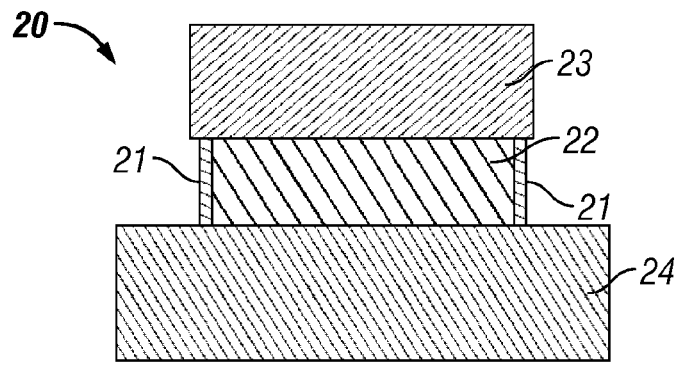
FIG. 6 shows a schematic illustration of an illustrative vertically oriented electronic device having a conductive film bound to a vertical edge extending between the device's electrical contacts.

In other various embodiments, the electronic devices have an optional conductive film bound to at least one vertical edge of the switching layer. The optional conductive film makes a switchably conductive state more easily obtainable during electrical configuration and initialization of the electronic devices. Such conductive films also may be used to increase electronic device uniformity, stability and strength. FIG. 6 shows an illustrative vertically oriented electronic device 20 having conductive film 21 bound to the vertical edge of silicon oxide layer 22, extending between electrical contacts 23 and 24. In some embodiments, the conductive film is discontinuous such that there is at least one gap between the first electrical contact and the second electrical contact. In some embodiments, the at least one gap is less than about 1 μm. However, in other embodiments, the at least one gap is less than about 100 nm or less than about 20 nm.

In some embodiments, the electronic devices may have an optional adhesion layer such as, for example, titanium to increase adherence of a metallic electrical contact to the switching layer containing silicon oxide. In other embodiments, at least one of the electrical contacts and/or the switching layer may be deposited on a thin layer of a material such as, for example, silicides or titanium nitride. For example, in some embodiments, titanium nitride layers of the present electronic devices may be about 10 nm thick.

In general, the electrical contacts and switching layers of the electronic devices described herein may have any thickness. Optimization of the thickness and stoichiometry of the switching layer, in particular, may be used to obtain optimum electronic device performance. In some embodiments, the switching layer has a thickness between about 5 nm and about 1000 nm. In more specific embodiments, the switching layer has a thickness greater than about 40 nm. In general, electronic devices described herein were still functional in switching and memory applications when the switching layer thickness was 20 nm and under, although the device performance was somewhat degraded compared to electronic devices having a switching layer thickness of 40 nm. It should again be emphasized that variation of switching layer thickness as a means for optimizing electronic device performance lies within the spirit and scope of the present disclosure and is within the capabilities of one of ordinary skill in the art.

As previously noted, and as will be demonstrated in the experimental examples, the present electronic devices can be memory elements or memristors. In some embodiments, the electronic devices are a memory element having at least one ON state and at least one OFF state. In some embodiments, the electronic devices have one ON state and one OFF state. In other embodiments, the electronic devices are multi-level memory elements having more than one ON and/or OFF state. The multi-level memory performance allows the present electronic devices to function in a manner similar to and be competitive with conventional flash memory. In some embodiments, the electronic devices switch between the at least one ON state and the at least one OFF state by unipolar or bipolar switching.

In some embodiments, the electronic devices have an ON/OFF current ratio of at least about $10^4$. In other embodiments, the electronic devices have an ON/OFF current ratio of at least about $10^3$ or at least about $10^2$. In still other embodiments, the electronic devices have an ON/OFF ratio ranging between 2 and about $10^6$. Such ON/OFF current ratios allow the electronic devices to exist in distinct memory states that are easily readable and identifiable, particularly in multi-level memory applications.

In addition, the present electronic devices advantageously have very fast switching times of less than about 1 µs. In some embodiments, the switching times are less than about 50 ns or less than about 1 ns. This fast switching time also makes the electronic devices competitive with conventional flash memory.

A further advantage of the present electronic devices is that they are extremely radiation resistant and maintain their memory state upon exposure to very high doses of radiation, such as X-ray radiation, heavy ion radiation and proton radiation. For example, at radiation doses much higher than would result in failure of conventional flash memory, the present electronic devices maintain their memory state and switching ability. As such, some embodiments of the present disclosure contemplate radiation-hardened articles of manufacture containing the electronic devices disclosed herein.

In addition, the present electronic devices may be fashioned into a memory array containing a plurality of electronic devices in which each of the plurality of electronic devices is independently electrically addressable. Such arrays may be implemented as memory element and memristor arrays where very dense switching capabilities are desired such as, for example, computers and various personal electronic devices. In some embodiments, the arrays have a crossbar architecture of the electronic devices such as that shown in FIG. 24. In such embodiments of the arrays, having a diode in electrical conjunction with each switching element (i.e., electronic device) can be advantageous for programming in some embodiments. In alternative embodiments, a diode may be embedded in the conductive wires between adjacent electronic devices in the array.

In other various embodiments, methods for making, configuring and operating the present electronic devices are disclosed herein.

In some embodiments, methods for making a vertically oriented two-terminal electronic device, such as that shown in FIG. 3, for example, are disclosed herein. The methods include providing a first conductive layer containing a first electrical conductor, depositing a switching layer containing a switchably conductive silicon oxide on the first conductive layer, and depositing a second conductive layer on the switching layer. Methods for depositing the conductive layers and the switching layer have been previously described hereinabove. In some embodiments, the first conductive layer is part of a conductive substrate such as, for example, silicon. In other embodiments, the first conductive layer is a conductor such as, for example, silicon or a metal deposited on a non-conductive substrate. In further embodiments, the methods also include etching the second conductive layer and the switching layer to define at least one vertical edge in the switching layer extending between the first conductive layer and the second conductive layer. As previously described, etching the second conductive layer and the switching layer may take place by techniques such as, for example, wet etching and dry etching according to techniques known to those of ordinary skill in the art.

Likewise, in some embodiments, the silicon oxide of the switching layer may be $SiO_2$, defect-laden $SiO_2$ or $SiO_x$ that has been converted into a switchably conductive state. As previously described, the switchably conductive silicon oxide may be formed from $SiO_2$ or $SiO_x$ after being deposited between the first conductive layer and the second conductive layer. Deposition techniques include, for example, sputtering, thermal deposition (thermal oxidation), chemical vapor deposition, thermal evaporation, electron-beam evaporation, molecular beam epitaxy, atomic layer deposition and deposition from solution. As also previously described, additional defects may be introduced in the silicon oxide by techniques such as, for example, wet- or dry-etching of the second conductive layer and the switching layer. In some embodiments, the switchably conductive silicon oxide is formed by applying at least one voltage sweep or pulse of appropriate magnitude to the electronic device at or above a soft electrical breakdown voltage of the silicon oxide, but below a hard electrical breakdown voltage. In other words, the switching layer may initially be deposited in a non-conductive state and thereafter converted into a switchably conductive state through an electroforming process.

In some embodiments, methods for configuring and operating electronic devices of the present disclosure are described herein. In some embodiments, the methods include operation of the electronic devices as a memory or switching element.

In some embodiments, the methods include providing an electronic device containing a first electrical contact and second electrical contact arranged to define a gap region therebetween, a substrate, and switching layer containing a silicon oxide deposited in the gap region between the first electrical contact and the second electrical contact. At least the first electrical contact is deposed on the substrate. The methods further include applying an activating voltage to the electronic device to convert the silicon oxide into a switchably conductive state. The activating voltage is part of an electroforming process. In some embodiments, the switching layer includes at least one vertical edge extending between the first electrical contact and the second electrical contact. In various embodiments, the activating voltage may be applied as at least one continuous voltage sweep or at least one voltage pulse.

Without being bound by theory or mechanism, Applicants believe that application of the activating voltage to the electronic device results in formation of a silicon nanocrystal switchably conductive pathway within the silicon oxide of the switching layer, thereby electrically connecting the first electrical contact to the second electrical contact. In some embodiments, the conductive pathway is along a vertical edge of the switching layer. This mechanistic interpretation is consistent with experimental results presented hereinbelow. However, as previously mentioned, the switchably conductive pathway is not limited to an edge of the switching layer. For example, in some embodiments, the switching layer may be constructed with a pre-established conductive pathway away from an edge region. The likelihood of silicon nanocrystals forming a switchably conductive pathway within the silicon oxide suggests that other silicon-rich oxide materials might be used in forming the switching layer. For example, in some embodiments, silicon-rich ternary oxide materials capable of replacing $SiO_2$ or $SiO_x$ include, for example, $SiO_aN_b$ and $SiO_aC_b$, where a and b is are non-zero numbers less than or equal to 10. In some embodiments, a and b are non-zero numbers less than or equal to 4. In some embodiments, a is greater than b, and in other embodiments, a is less than b. In some embodiments, seeding or doping the silicon oxide with other nanocrystals could lower the voltages necessary to achieve a switchably conductive state.

In some embodiments, the methods further include programming (e.g., writing or erasing) and reading the electronic device to serve as a memory element or memristor. In some embodiments, the above methods further include applying a first programming voltage to the electronic device to set the electronic device to a first conductivity state, which can be an ON state or an OFF state. In further embodiments, the methods further include applying a reading voltage to the electronic device and reading the current flowing therethrough. The reading voltage is less than the first programming voltage and does not affect the first conductivity state. In other words, application of the reading voltage is non-destructive to the first conductivity state.

In some embodiments, the methods further include applying a second programming voltage to the electronic device to set the electronic device into second conductivity state, which can be an ON or OFF state. The second programming voltage is larger in magnitude than the first programming voltage when the second conductivity state is an OFF state. The second programming voltage is smaller in magnitude than the first programming voltage when the second conductivity state is an ON state. After setting the second conductivity state, in some embodiments, the methods further include applying the reading voltage to the electronic device and reading the current flowing therethrough. As with the first conductivity state, application of the reading voltage also does not affect the second conductivity state. In all cases, the voltages are below the hard electrical breakdown voltage of the electronic device.

In various embodiments of the methods, the first programming voltage and the second programming voltage have different magnitudes and are of the same polarity or the opposite polarity. In other words, once a given conductivity state is set, the conductivity state can be turned into another conductivity state by application of a programming voltage of different magnitude having a positive or negative polarity. In this sense, the electronic devices of the present disclosure function as classical unipolar switches. However, in some embodiments, it may also be possible for the present electronic devices to function in a bipolar switching mechanism, and the switching mechanism should not be considered as limiting toward the various embodiments presented herein.

EXPERIMENTAL EXAMPLES

The following examples are provided to more fully illustrate some of the embodiments disclosed hereinabove. It should be appreciated by those of ordinary skill in the art that the methods disclosed in the examples that follow represent techniques that constitute illustrative modes for practice of the disclosure. Those of ordinary skill in the art should, in light of the present disclosure, appreciate that many changes can be made in the specific embodiments that are disclosed and still obtain a like or similar result without departing from the spirit and scope of the disclosure.

Example 1

Fabrication and Testing of Horizontally Oriented Electronic Device.

Figure 7:
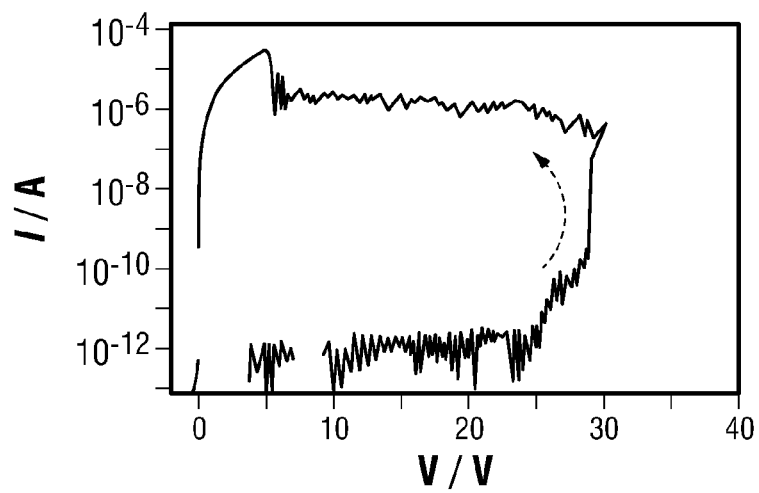
FIG. 7 shows an illustrative current versus voltage plot demonstrating the initial activation of $SiO_2$ into a switchably conductive state in a horizontally oriented electronic device.

A pair of W electrodes separated by ~50 nm on a thermal-oxidized Si surface ($SiO_2$ thickness of 200 nm) were defined by standard electron-beam lithography and lift-off. Electrical characterization was performed in a vacuum environment (~$10^{-5}$ Torr). FIG. 7 shows an illustrative current versus voltage plot demonstrating the initial activation of $SiO_2$ into a switchably conductive state in a horizontally oriented electronic device. Bias voltage was applied between the two electrodes by sweeping from 0 to 30 V and then back to 0V. There was no conduction observed during the initial forward sweep from 0 to 25 V before a sudden and substantial current increase between 25 and 30 V, which corresponds to the soft breakdown of $SiO_2$. During the backward sweep, the increased conduction was maintained from 30 to 6 V. At 6 V, another sudden current increase was observed, which is characteristic of hysteretic current versus voltage behavior.

Figure 8:
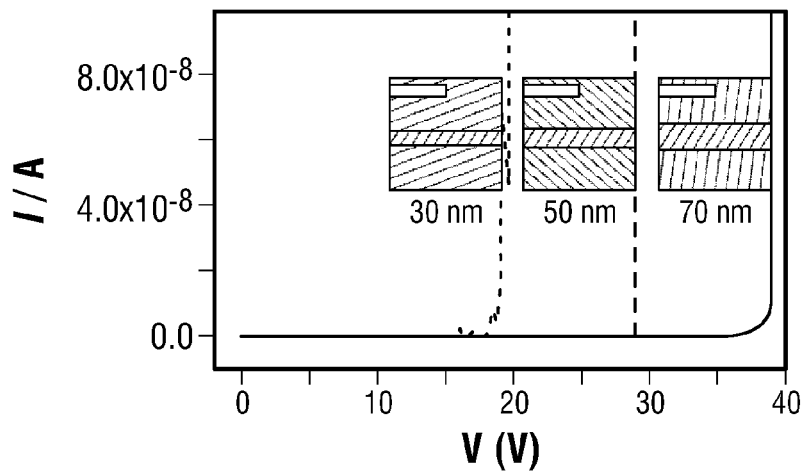
FIG. 8 shows illustrative current versus voltage plots for horizontally oriented electronic devices having electrode separations of 30, 50 and 70 nm.

The separation between electrodes determined the voltage at which the initial sharp increase in current was observed during activation of the horizontally oriented electronic devices. FIG. 8 shows illustrative current versus voltage plots for horizontally oriented electronic devices having electrode separations of 30, 50 and 70 nm. The inset beside each curve shows an illustrative SEM image of the $SiO_2$ layer between electrodes. As shown in FIG. 8, larger electrode separations increased the voltage at which the initial sharp current increase was observed. For example, when the electrode spacing was only 30 nm, the initial current increase occurred at ~18 V, whereas when the electrode spacing was increased to 70 nm, the initial current increase became ~39 V. The initial onset of conduction varied nearly linearly with the electrode separation. The corresponding averaged electric field was ~6 MV/cm, which falls into typical values seen for $SiO_2$ voltage-induced breakdown.

Figure 9:
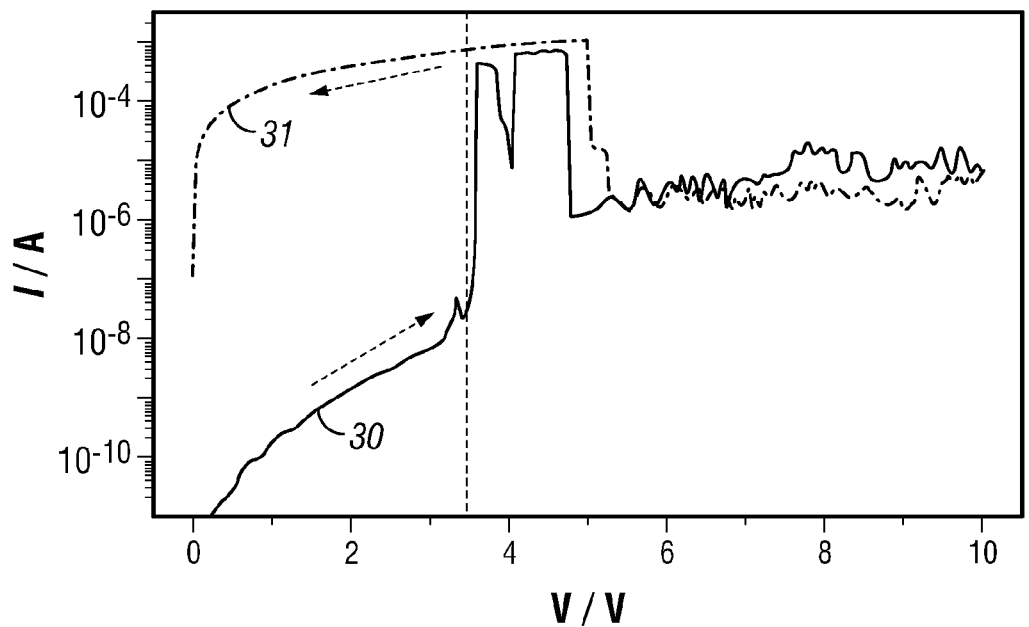
FIG. 9 shows an illustrative current versus voltage sweep for a horizontally oriented electronic device, starting from 0 V, proceeding to 10 V and sweeping back again to 0 V.

FIG. 9 shows an illustrative current versus voltage sweep for a horizontally oriented electronic device, starting from 0 V, proceeding to 10 V and sweeping back again to 0 V. As shown in FIG. 9, during the forward sweep 30, the electronic device was in an OFF state from 0 to ~3.5 V before a sudden increase in current occurred at ~3.5 V to define an ON state. The device remained in the ON state until a voltage of ~5 V was reached, where the current again lowered to define an OFF state. In the backward sweep 31, the current again increased at ~5 V to reset the ON state. However, further sweeping below ~3.5 V maintained the device in an ON state as the current versus voltage curve did not retrace that of the forward sweep, thereby defining a hysteresis.

Figure 10:
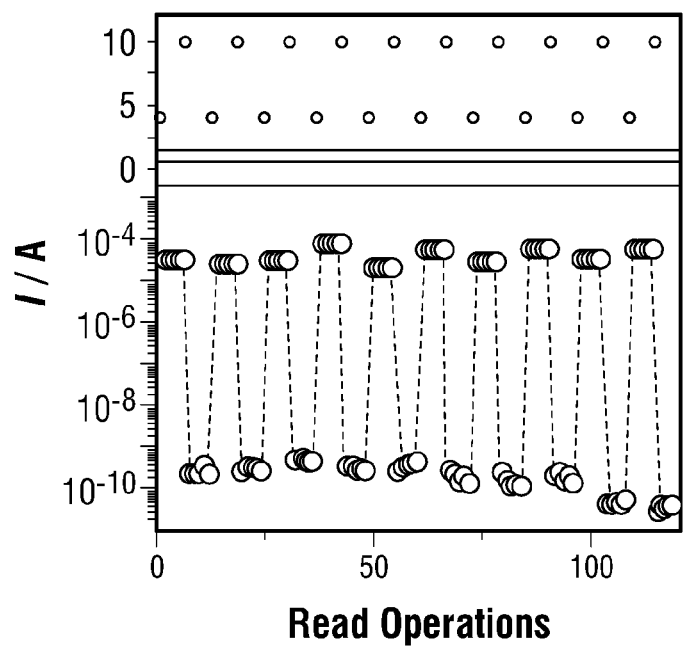
FIG. 10 shows a chart illustrating memory performance of a horizontally oriented electronic device in the presence of a 1 V reading pulse.

The sharp current change between the ON and OFF states allows the electronic devices to function as a memory element. Specifically, by applying a voltage between 3.5 and 5 V sets the device into an ON state, which can subsequently be non-destructively read with a short, low voltage pulse between 0 and ~3.5 V. In the present example, the electronic device was set into an ON state with a voltage pulse of 4 V and subsequently read by applying a reading voltage pulse of 1 V, which produced a corresponding read current in the electronic device. The device was subsequently set into an OFF state by applying a voltage pulse greater than 5 V. In the present example, a voltage pulse of 10 V was applied. The memory characteristics defined by the above behavior is shown in FIG. 10. FIG. 10 shows a chart illustrating memory performance of the horizontally oriented electronic device in the presence of a 1 V reading pulse. As shown in FIG. 10, the electronic device was placed in an ON state (written) by a 4 V pulse and read 5 times with a 1 V reading pulse. The current was stable between sequential reads, indicating that the reading process was non-destructive. The horizontally oriented electronic device was subsequently placed into an OFF state (erased) with a 10 V pulse and read again 5 times with a 1 V reading pulse. FIG. 10 additionally demonstrates that the write/read/erase/read cycle was repeatable multiple times to achieve the same read current in sequential ON and OFF states. In each case, the ON/OFF ration was approximately $10^5$. In summary, the stability of the read current in the ON and OFF states allows the present electronic devices to function as a memory element.

Example 2

Fabrication and Testing of a Vertically Oriented Electronic Device.

Illustrative vertically oriented electronic devices containing a silicon oxide have been previously shown in FIG. 3 herein. FIGS. 11A and 11B present additional examples of vertically oriented electronic devices, along with non-limiting methods for forming them. Electrode fabrication and device patterning was accomplished by two different methods. In a first approach, a lift-off process was used to define a W electrode on a $SiO_2$ layer via metal sputtering on a 5 nm thick Ti adhesion layer. The W electrode was 100 nm in thickness and 50 μm in diameter. Buffered oxide etching (BOE) (see FIG. 11A) was then used to remove the surrounding $SiO_2$ and establish a vertical edge in the $SiO_2$ layer. In a second approach, 10 nm of TiN and 100 nm of W were first deposited on a $SiO_2$ layer by physical vapor deposition. A 70×70 μm² photoresist area was then patterned by photolithography and used as a sacrificial mask. Reactive ion etching (RIE) (see FIG. 11B) was then used to pattern the device, and the photoresist was thereafter removed. In either case, initial deposition of $SiO_2$ was accomplished by two different methods. In a first approach, 50 nm of thermal $SiO_2$ was grown on a silicon substrate by thermal oxidation (thermal $SiO_2$, see FIG. 11A). In a second approach, 50 nm of $SiO_2$ was grown by plasma-enhanced chemical vapor deposition (PECVD) on a TiN/Si substrate (see FIG. 11B). In either case, the vertically oriented electronic devices were optionally annealed at 600° C. in an $Ar/H_2$ environment for several minutes before electrical characterization was performed.

Electrical characterizations were performed by applying a bias voltage from a probe tip touching the W electrode with the silicon substrate grounded. As before, the electrical characterizations were conducted in vacuum at room temperature unless otherwise noted. FIG. 12 shows an illustrative current versus voltage sweep for a vertically oriented electronic device from 0 to +8 V and back to 0 V. The current versus voltage sweep shown in FIG. 12 is for the electronic device shown in FIG. 11A. Similar current versus voltage behavior was found for the electronic device shown in FIG. 11B. As shown in FIG. 12, the forward sweep 35 featured an initial high-impedance state at low bias, followed by a sudden current increase at ~3.3 V to a low-impedance state and a subsequent drop at ~5 V back into a high impedance state. Backward sweep 36 of FIG. 12 showed that a high-impedance state was again entered at ~5 V, but unlike the forward sweep 35, the high-impedance state was maintained at voltages below ~3.3 V. This hysteretic behavior allows the electronic device to function as a memory element, as shown in FIG. 13.

Figure 13:
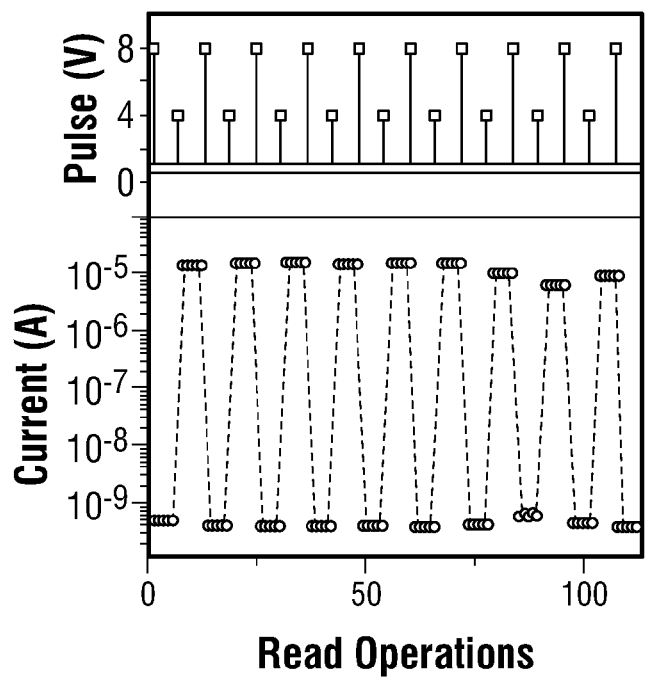
FIG. 13 shows a chart illustrating memory performance of a vertically oriented electronic device in the presence of a 1 V reading pulse.

FIG. 13 shows a chart illustrating memory performance of a vertically oriented electronic device in the presence of a 1 V reading bias voltage. The memory performance shown is for the electronic device of FIG. 11A. Similar memory performance was observed for the electronic device of FIG. 11B. As shown in FIG. 13, the vertically oriented electronic device could be written into an ON state with a pulse of 4 V and thereafter switched back into an OFF state with a pulse of 8 V. The memory state so obtained was then non-destructively read at a voltage below ~3.3 V. In the chart of FIG. 13, the reading voltage was 1 V, and the electronic device was read 5 times between pulses to turn the electronic device into an ON or OFF state. The ON/OFF ratio was >$10^4$, and no degradation of ON/OFF current was seen after more than 100 read operations. As shown hereinafter, the electronic devices may be configured to have multiple memory states.

Figure 14:
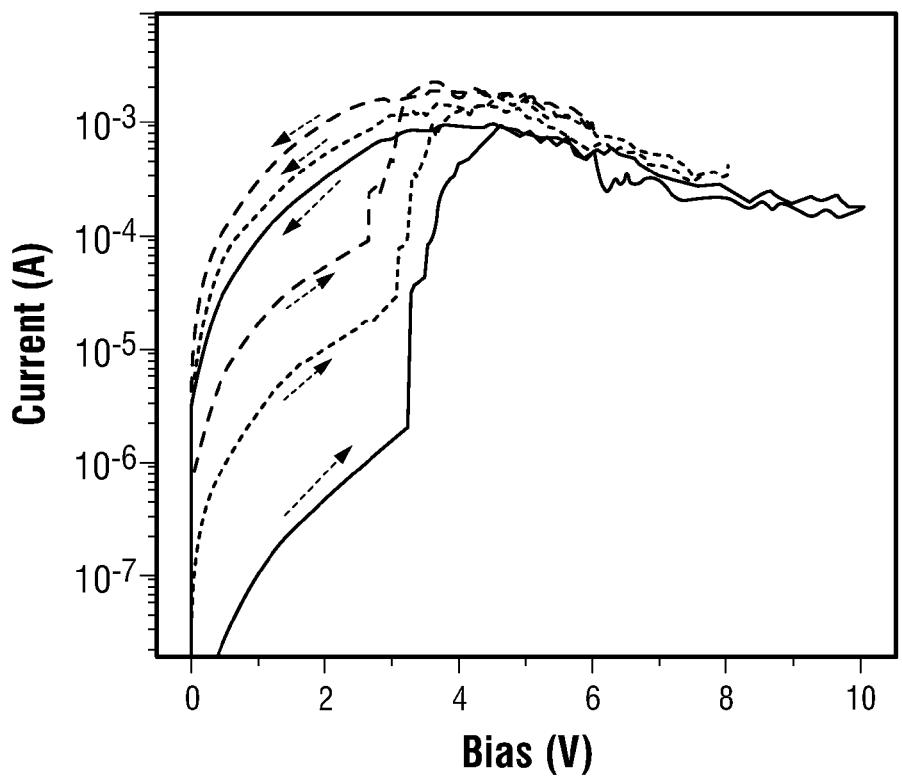
FIG. 14 shows an illustrative series of variable range current versus voltage sweeps for the electronic device of FIG. 11B.

Similar switching and memory behavior was seen in the electronic device shown in FIG. 11B. FIG. 14 shows an illustrative series of variable range current versus voltage sweeps for the electronic device of FIG. 11B. As shown in FIG. 14, the stopping point of the forward sweep changed the conduction state and ON/OFF ratio of the device. In other words, the stopping point of the forward sweep changed the position of the hysteresis in the current versus voltage sweep. Decreasing the voltage sweep range led to a gradual lowering of the ON/OFF ratio because of an increased current in the OFF state set by the lower ending bias voltage of the forward sweep. With a shorter forward sweep, the writing region shifted slightly toward a lower bias voltage, and the ON current increased, thereby accounting for the lower ON/OFF ratios. This behavior may be used to establish multiple memory states in the electronic devices.

Figure 15:
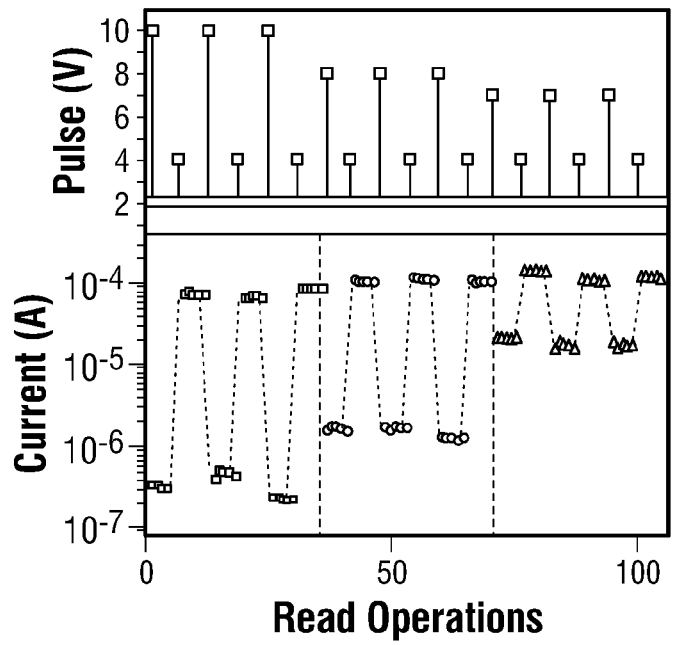
FIG. 15 shows a chart illustrating multi-level memory performance of a vertically oriented electronic device.

FIG. 15 shows a chart illustrating multi-level memory performance of a vertically oriented electronic device. The multi-level memory performance shown for the electronic device of FIG. 11B, although similar memory performance occurred for the device of FIG. 11A. As shown in FIG. 15, at a constant write pulse (ON pulse) of 4 V and variable erase pulses (OFF pulses) of 10, 8 and 6 V, vastly different read currents were obtained upon applying a reading voltage of 1 V. The memory performance of the vertically oriented electronic device shows that the devices are not limited to binary operation with only 0 and 1 ON/OFF states, depending on how the devices are operated. Instead, there are multiple OFF states in the electronic devices depending on the magnitude of the OFF voltage pulse applied. Without being bound by theory or mechanism, Applicants believe that the variable OFF bias voltages result in different numbers of conducting pathways being broken in achieving the OFF state.

Etching processes used to form the vertically oriented electronic devices generally appeared to be necessary for conduction to occur. For example, when control devices were fabricated without an etching step to define a vertical edge in the switching layer, no conduction was observed up to an applied bias voltage of 25 V. This result suggests that the switching behavior takes place at or near a vertical edge in the devices between the electrodes. However, as previously described, Applicants contemplate that a switchably conductive pathway may be formed at locations away from the edge of the switching layer, and the switching location should not be considered as limiting.

Example 3

Fabrication and Testing of a Vertically Oriented Electronic Device Containing Non-Metallic Electrodes.

Figure 16:
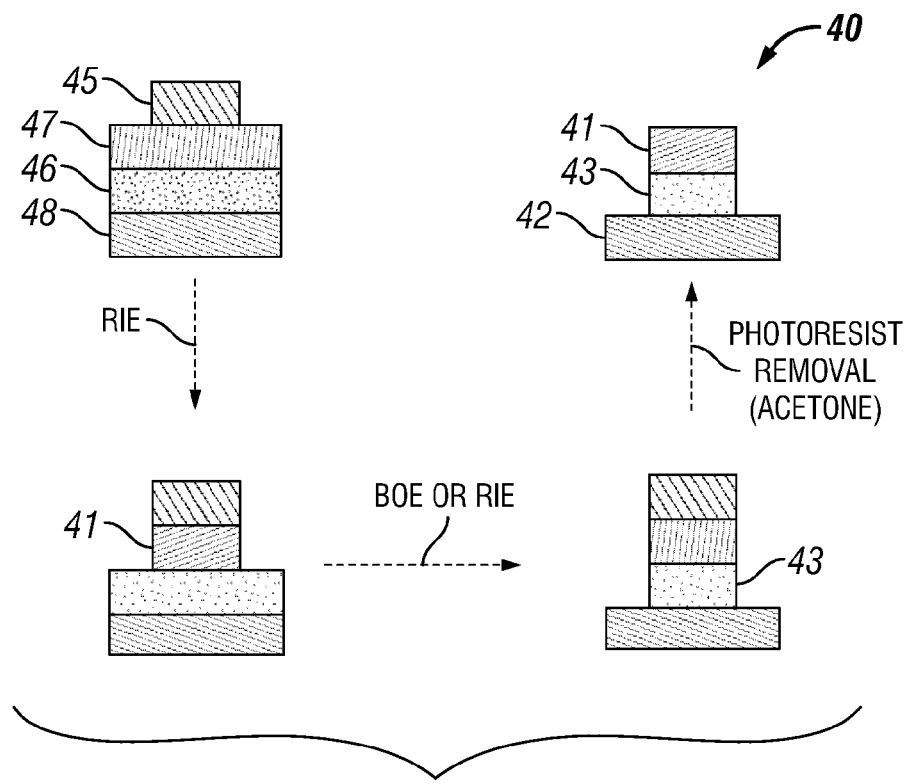
FIG. 16 shows an illustrative process through which a vertically oriented electronic device can be made with polysilicon electrodes.

FIG. 16 shows an illustrative process in which a vertically oriented electronic device 40 can be made with polysilicon electrodes 41 and 42. Photoresist layer 45 was first patterned as a sacrificial mask on a three-layer structure containing an $SiO_x$ layer 46 deposited between two layers of polysilicon 47 and 48. Reactive ion etching RIE) was then performed to etch away the top polysilicon layer using $SF_6$ to form top polysilicon electrode 41. Etching of the $SiO_x$ layer was then performed by wet-etching (buffered-oxide etch-BOE) or dry-etching (RIE with $CHF_3/O_2$) to define switching layer 43. Reactive ion etching usually produced no undercut of switching layer 43 in the electronic devices, whereas a marginal amount of undercut occurred when buffered-oxide etch was used. Even in the cases where undercutting of switching layer 43 did occur, the electronic device structure remained stable, as there was no collapse of the top polysilicon electrode 41 observed at the edge region. After etching of switching layer 43, the photoresist layer 45 was thereafter removed with acetone.

For the electronic device shown in FIG. 16, the switching layer 43 containing $SiO_x$ had stoichiometry of x=1.9-2 and a thickness of 40 nm. $SiO_x$ layer thicknesses of 20 nm and 10 nm also exhibited memory performance, but such electronic devices having thinner $SiO_x$ layers had reduced robustness and performance reproducibility. The polysilicon layers were 70 nm thick. After photoresist mask removal and prior to initialization and electrical testing, the electronic device was annealed in vacuum for 10 minutes at 600° C. Identical switching and memory behavior was observed in the electronic device regardless of the etching method used.

Figure 17:
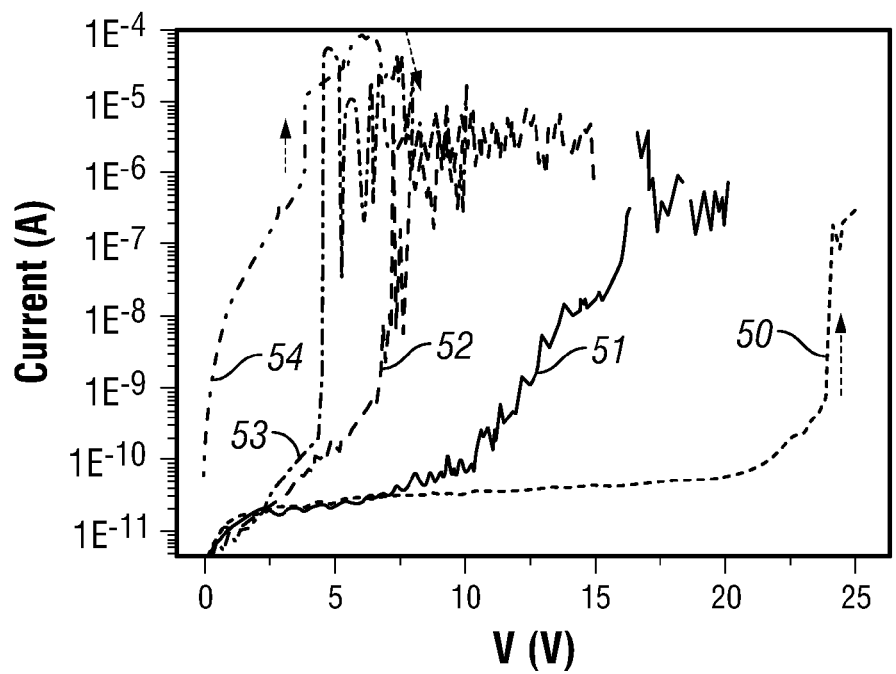
FIG. 17 shows illustrative current versus voltage sweeps during initialization and configuration of a vertically oriented electronic device containing polysilicon electrodes.
Figure 18:
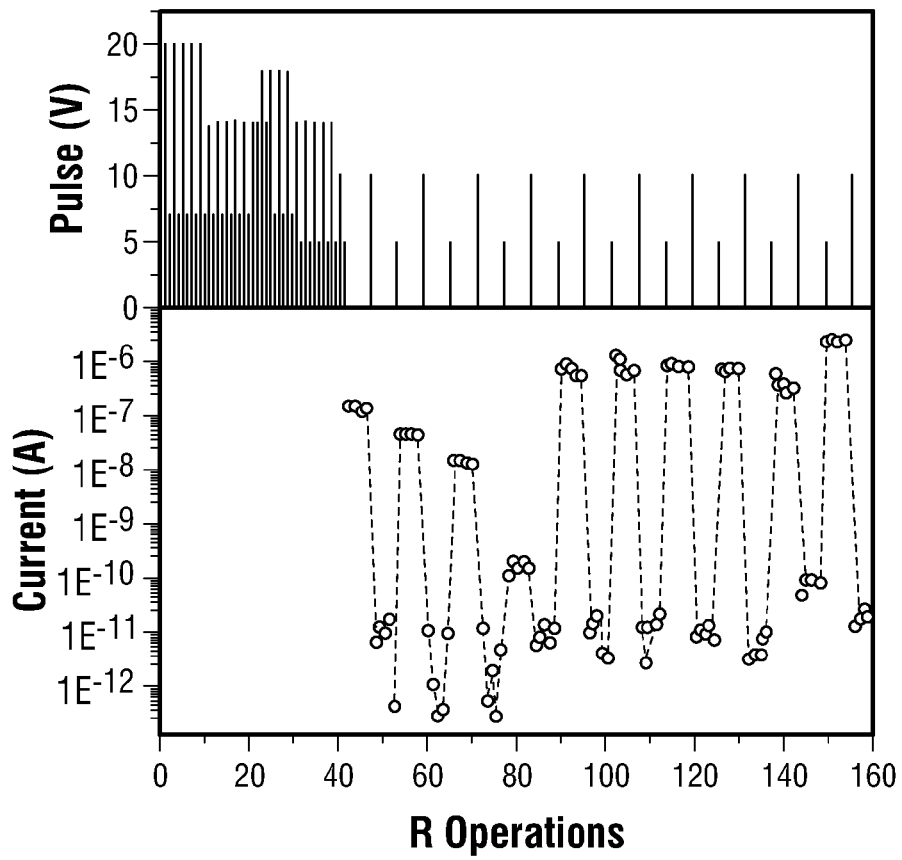
FIG. 18 shows an illustrative chart demonstrating pulse initialization and configuration of a vertically oriented electronic device containing polysilicon electrodes.

FIG. 17 shows illustrative current versus voltage sweeps during initialization and configuration of the vertically oriented electronic device containing polysilicon electrodes. During an initial sweep 50 from 0 to 20 V, the device was initially non-conductive. Subsequent sweeps (51-54) from 0 to 20 V gradually produced increased conductivity, until on the fifth sweep 54, a current versus voltage sweep having a distinct ON and OFF state was observed. Again without being bound by theory or mechanism, Applicants believe that the initialization and configuring process results in formation of conductive pathways in the $SiO_x$ layer, as discussed in more detail hereinafter. As an alternative to sweep initialization and configuration, the electronic devices may also be initialized by applying a series of voltage pulses. FIG. 18 shows an illustrative chart demonstrating pulse initialization and configuration of a vertically oriented electronic device containing polysilicon electrodes. As shown in FIG. 18, the electronic device was initially non-conductive before reaching a conductive state after about 40 voltage pulses.

Figure 19:
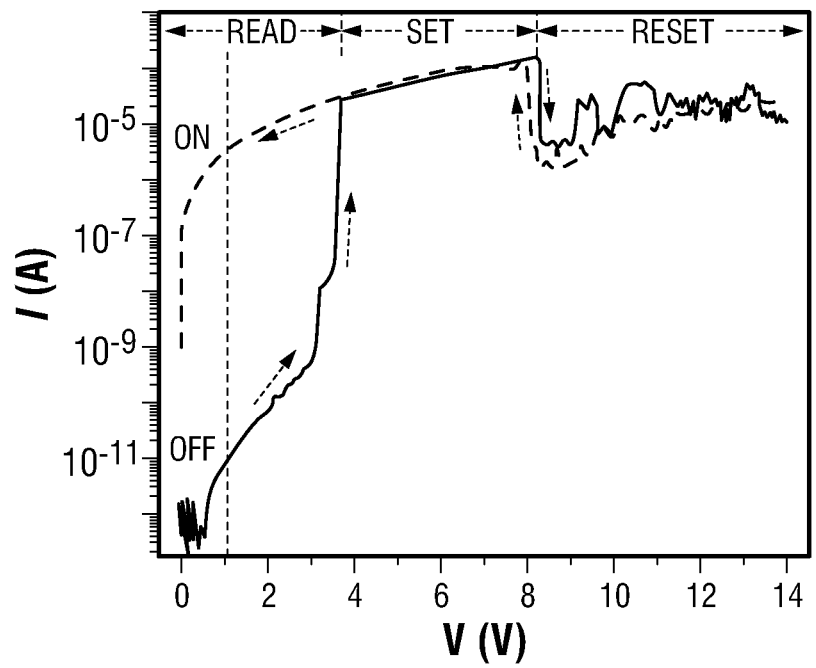
FIG. 19 shows an illustrative current versus voltage plot from 0 to +14 V and then back to 0 V for a vertically oriented electronic device containing polysilicon electrodes.
Figure 20:
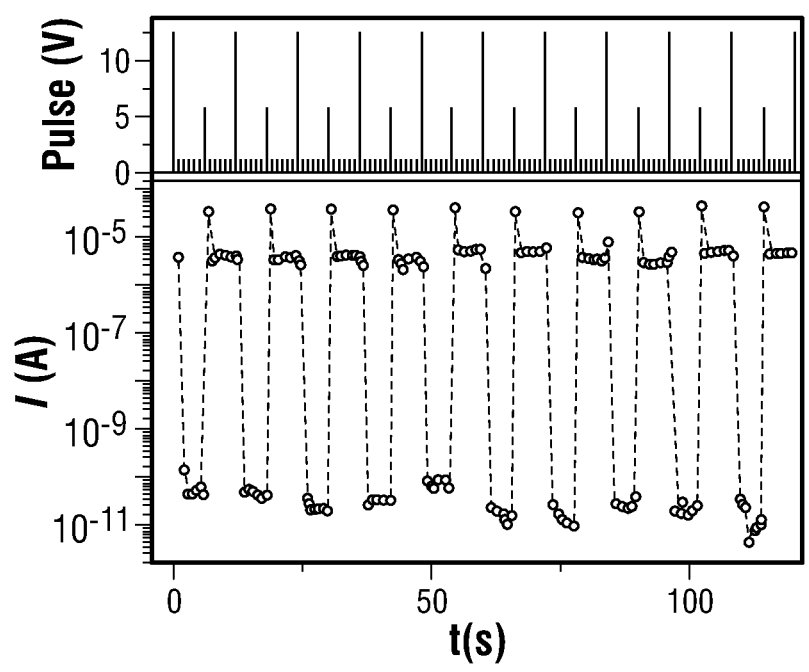
FIG. 20 shows a chart illustrating memory performance of a vertically oriented electronic device containing polysilicon electrodes.

FIG. 19 shows an illustrative current versus voltage plot from 0 to +14 V and back to 0 V for the vertically oriented electronic device containing polysilicon electrodes. As shown in FIG. 19, the electronic device was switched ON at a bias voltage of ~3.5 V and switched OFF at ~8 V. Hysteretic behavior was observed in the backward sweep from +14 V to 0 V, similar to that seen in the vertically oriented electronic devices of Examples 1 and 2, which contained at least one metallic electrode. FIG. 20 shows a chart illustrating the memory behavior of the vertically oriented electronic device containing polysilicon electrodes. As shown in FIG. 20, the electronic device was switched into an ON state with a 6 V pulse and then switched into an OFF state with a 13 V pulse. Reading at a bias voltage of 1 V between each ON and OFF pulse demonstrated that a stable memory state was obtained.

Without being bound by theory or mechanism, it is believed that the switching mechanism of the electronic devices described herein occurs due to formation of silicon nanocrystals in the $SiO_x$ matrix of the switching layer as a conduction pathway between electrodes. Although formation of metallic nanowires originating from metallic electrodes could account for conduction and switching in the electronic devices of Examples 1 and 2, such metallic nanowires cannot form in the non-metallic embodiment of Example 3. This suggests that a similar non-metallic conduction pathway also forms in the embodiments of Examples 1 and 2. Further, the ON/OFF voltages of a metallic conductor are typically much higher than any of observed in any of the present examples. Applicants have demonstrated that the silicon nanocrystals of the present embodiments are very small (diameter<5 nm), which suggests that the present electronic devices can be miniaturized to very small levels much below those presently described.

Figure 21A:
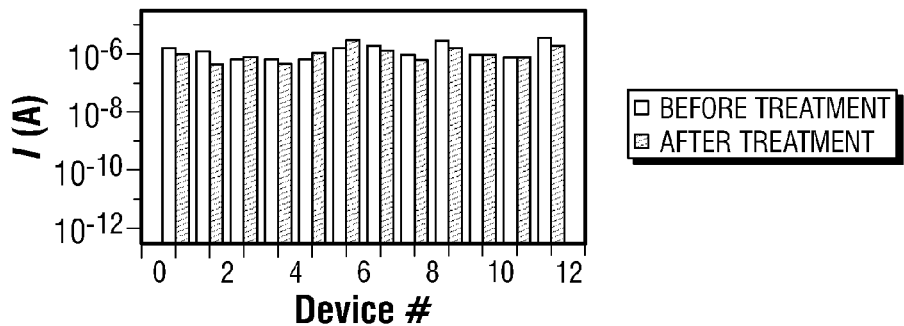
FIGS. 21A and 21B show charts demonstrating stored ON states for several illustrative vertically oriented electronic devices containing polysilicon electrodes after being heating at 700° C. in $Ar/H_2$ (FIG. 21A) and in air (FIG. 21B)
Figure 21B:
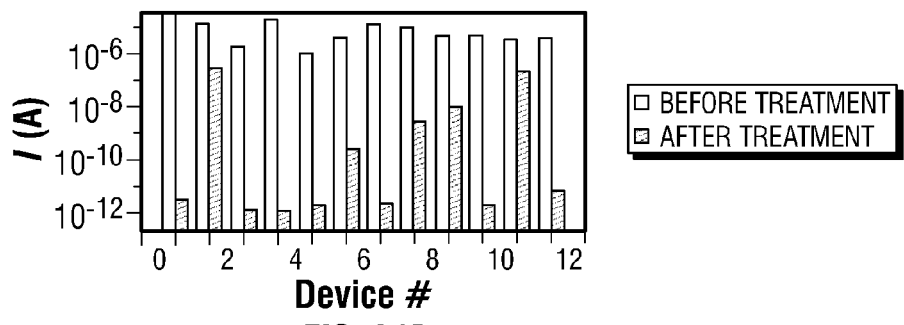

The stored memory states in the electronic devices of the present example were stable to 700° C. in an $Ar/H_2$ environment, but their stored memory states degraded significantly upon exposure to air. FIGS. 21A and 21B show charts demonstrating stored ON states for several illustrative vertically oriented electronic devices containing polysilicon electrodes after being heating at 700° C. in $Ar/H_2$ (FIG. 21A) and in air (FIG. 21B). As shown in FIG. 21A, all 12 electronic devices retained their ON states after annealing in $Ar/H_2$. FIG. 21B, in contrast, shows that a majority of the ON states were degraded after exposure to air as a consequence of oxidation. The high temperature resilience is yet another indication that the switching mechanism is not based on charge trapping.

Figure 22:
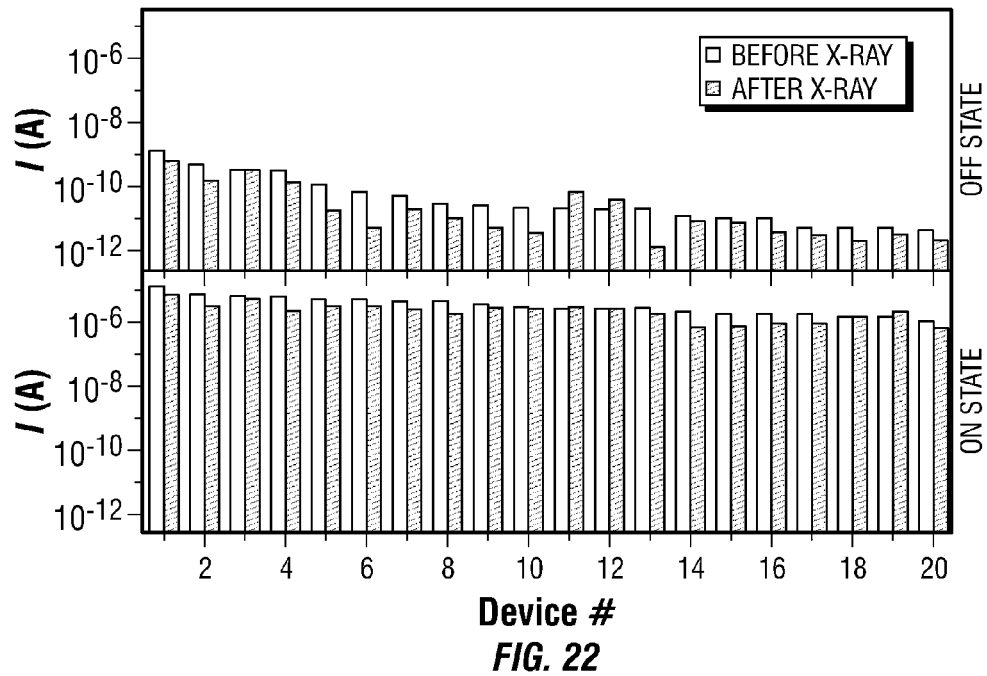
FIG. 22 shows a chart demonstrating stored ON and OFF states of several illustrative vertically oriented electronic devices after exposure to an 8 keV X-ray source at an estimated dose of ~2 Mrad.

The vertically oriented electronic devices were also not degraded by exposure of X-ray radiation. FIG. 22 shows a chart demonstrating stored ON and OFF states of several illustrative vertically oriented electronic devices after exposure to an 8 keV X-ray source at an estimated dose of 2 Mrad. This X-ray dose is an order of magnitude higher than the failure level of conventional charge-based flash memory. As shown in FIG. 22, the memory states were essentially unchanged by X-ray irradiation, regardless of whether electronic device was in an OFF state or an ON state while being irradiated. Similar stability of the electronic devices was obtained in the presence of a more energetic X-ray source (40 kV), as well as heavy ion and proton radiation. The stability to high radiation doses again indicates the memory behavior of the present electronic devices is not based on charge storage.

Figure 23:
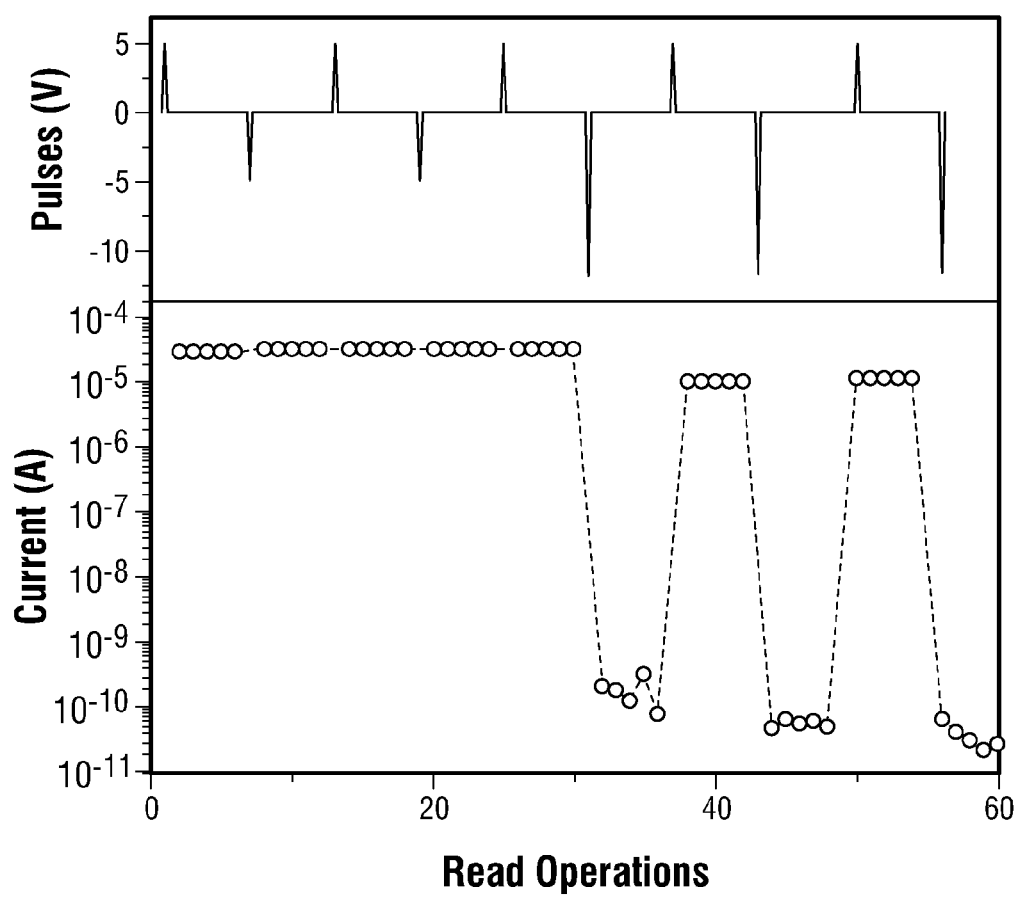
FIG. 23 shows a chart demonstrating illustrative memory performance in vertically oriented electronic devices when write and erase pulses of opposite polarity are applied.

Again without being bound by theory or mechanism, Applicants present data demonstrating that the electronic devices function in a unipolar way, wherein the switching behavior is dependent on the magnitude of the applied voltage, rather than polarity. FIG. 23 shows a chart demonstrating illustrative memory performance in the electronic devices when write and erase pulses of opposite polarity were applied. As shown in FIG. 23, the electronic devices could be switched into an ON state with a +5 V pulse and, after reading, be switched into an OFF state with a −10V pulse. The electronic devices could also be switched into an OFF state by a +10 V pulse (data not shown). The electronic device could then be switched back into an ON state with a +5 V pulse or a −5 V pulse (data not shown). The presented data shows that switching in the electronic devices is voltage-magnitude dependent but not polarity dependent. However, the electronic devices can also function in a bipolar manner by having write and erase voltages that have different magnitudes.

Example 4

Crossbar memory array (Prophetic Example).

Figure 24:
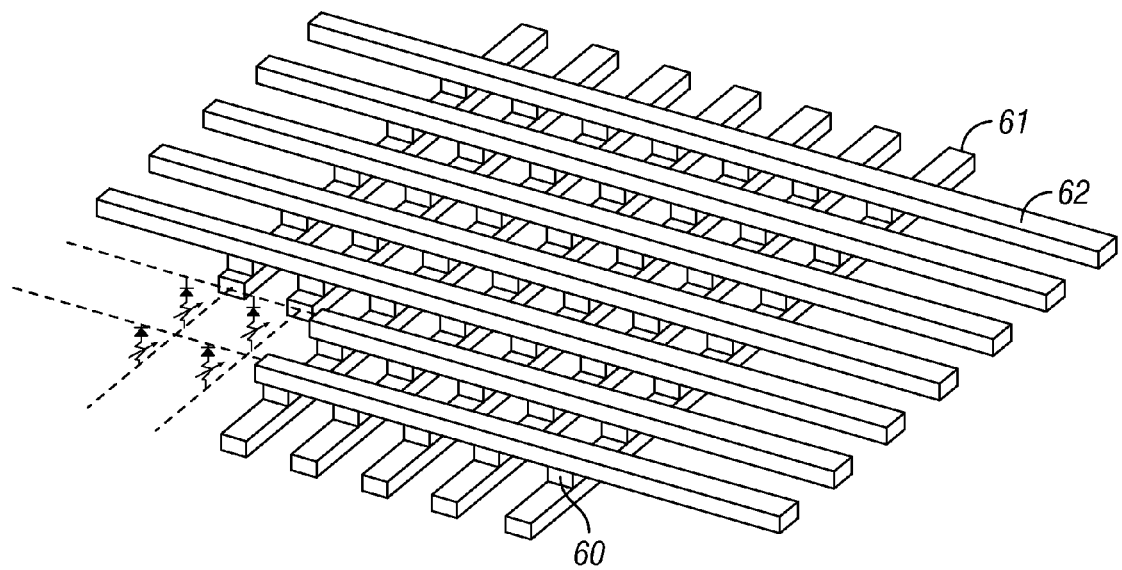
FIG. 24 shows an illustrative crossbar memory array containing multiple $SiO_x$ switching zones connected by a plurality of orthogonal conductive wires.
Figure 25:
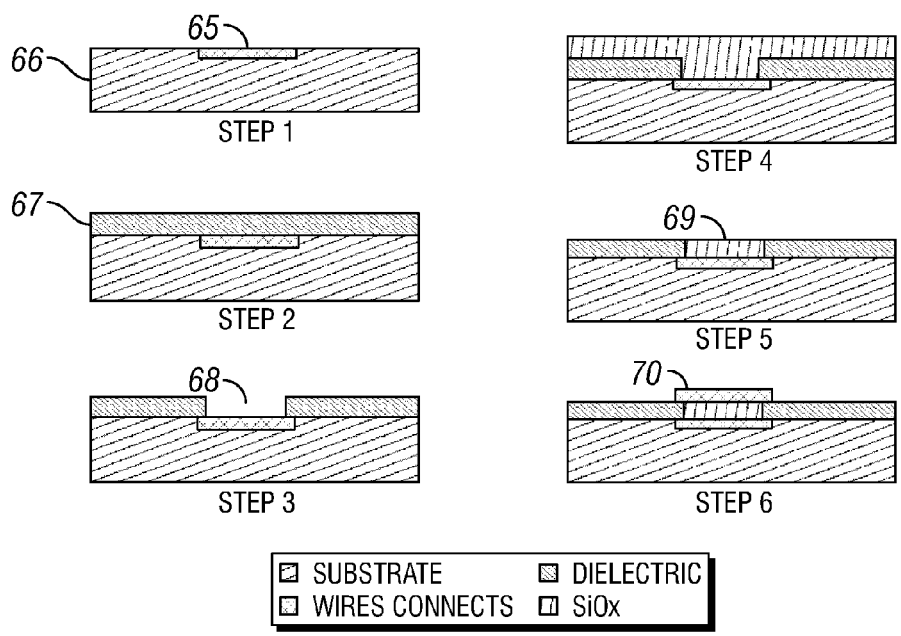
FIG. 25 presents a schematic illustration demonstrating a non-limiting process by which an illustrative crossbar memory array can be constructed.
Figure 26:
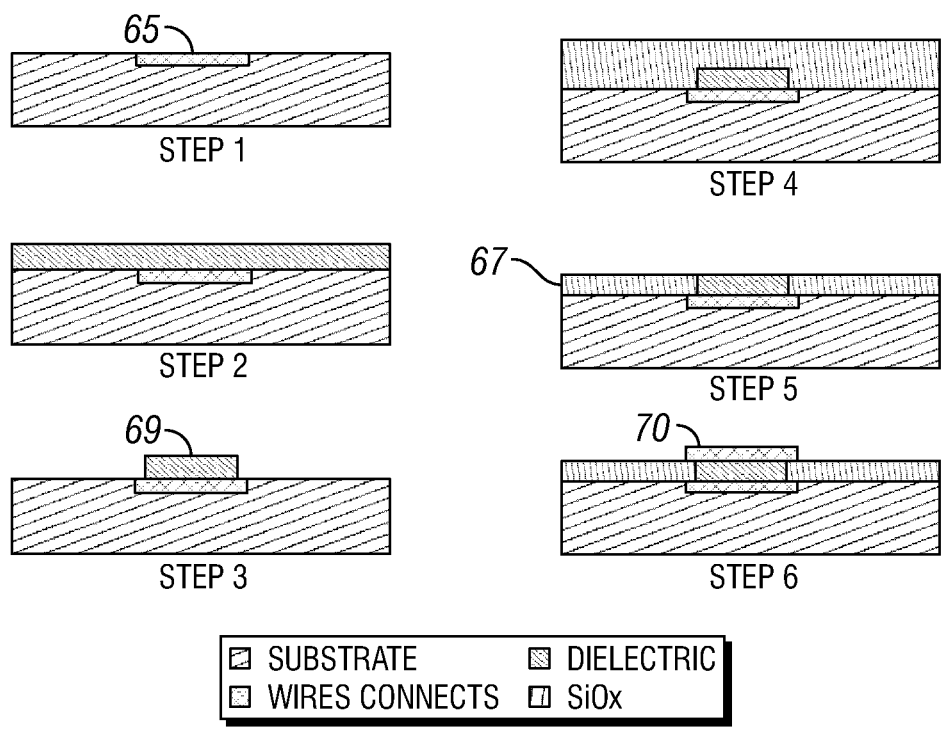
FIG. 26 presents a schematic illustration demonstrating another non-limiting process by which an illustrative crossbar memory array can be constructed.

Applicants also envision that a crossbar array architecture containing a plurality of electronic devices may be constructed. FIG. 24 shows an illustrative crossbar memory array containing multiple silicon oxide switching zones 60 connected by a plurality of orthogonal conductive wires 62 and 63. Each switching zone 60 may also be connected to a diode (not shown). FIG. 25 presents a schematic demonstrating an illustrative process by which a crossbar memory array can be constructed. As shown in FIG. 25, bottom wire 65 will be fabricated on an insulating substrate 66 by standard semiconductor fabrication techniques. Next, a dielectric film 67 (other than a silicon oxide) will be grown on bottom wire 65 and pore structures 68 will be defined in the dielectric film. Silicon oxide (e.g., $SiO_x$) 69 will then be deposited in the pore structures 68 (step 4), and excess $SiO_x$ concurrently deposited elsewhere will be removed (step 5). Finally, top wire 70 will be fabricated on top of each $SiO_x$ unit. FIG. 26 presents a schematic illustration demonstrating another illustrative process by which a crossbar memory array can be constructed. In the complementary scheme illustrated in FIG. 26, $SiO_x$ 69 will be first grown on top of the bottom wire 65 in the form of $SiO_x$ pillars (steps 2 and 3). Thereafter, the dielectric film 67 will be grown over the $SiO_x$ pillars and patterned to attach top wire 70.

In summary, the electronic devices disclosed herein have advantages that are among the following:

Non-volatility: Once written or erased, the memory state remains when unbiased (i.e., there is no current flowing) for an indefinite amount of time Two-terminal structure: The write, erase, and read functions of the present electronic devices share the same electrodes in a two-terminal configuration, allowing for increased ease of miniaturization over the three-terminal structure of conventional transistors.

Nondestructive reading endurance: The reading voltage used does not affect the stored memory states, if the reading voltage is below a certain level. Reading endurance shows no degradation after 10,000 continuous reading cycles for both ON and OFF states.

Non-charge based memory state: No degradation was observed for the stored memory states after X-Ray, heavy ion and proton radiation exposure, demonstrating the non-charge based nature of the electronic devices and their potential use in radiation hardened electronics.

Improved ON/OFF ratio: High ON/OFF ratios of up to $10^6$ or greater can be achieved, particularly after further miniturization.

Fast switching time: Pulse widths of ~1 μs and lower may be used for the writing/erasing operations.

Potential high density: The two-terminal nature and small sizes of the electronic devices potentially allow compact 2-D and 3-D memory arrays to be constructed.

Compatibility with CMOS technology: The structure and materials are fully compatible with standard CMOS technology.

From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure, which is defined in the following claims.

What is claimed is the following:

1. An electronic device comprising:
    a first electrical contact and a second electrical contact;
        wherein the first electrical contact and the second electrical contact are arranged so as to define a gap region therebetween;
    a substrate;
        wherein at least the first electrical contact is deposed on the substrate; and
    a switching layer comprising a switchably conductive silicon oxide residing in the gap region,
        wherein the switching layer further comprises silicon nanocrystals in the switchably conductive silicon oxide which form a switchably conductive pathway between the first electrical contact and the second electrical contact;
        wherein the electronic device is in a vertical orientation with the first electrical contact, the second electrical contact and the switching layer residing in a hole on the substrate;
        wherein the switching layer resides between the first electrical contact and the second electrical contact; and
        wherein the electronic device exhibits hysteretic current versus voltage properties.

2. The electronic device of claim 1, wherein the switchably conductive silicon oxide comprises defect-laden $SiO_2$.

3. The electronic device of claim 1, wherein the switchably conductive silicon oxide comprises $SiO_x$;
    wherein x is greater than 1 and less than 2.

4. The electronic device of claim 3, wherein x ranges between about 1.5 and 2.

5. The electronic device of claim 3, wherein x ranges between about 1.8 and 2.

6. The electronic device of claim 1, wherein the switchably conductive silicon oxide comprises $SiO_x$;
    wherein x ranges is greater than 0 and less than 1.

7. The electronic device of claim 1, wherein the first electrical contact is deposed on the substrate and the electronic device is in a vertical orientation with the switching layer residing between the first electrical contact and the second electrical contact.

8. The electronic device of claim 1, wherein the electronic device is in a horizontal orientation with the first electrical contact and the second electrical contact spaced apart on the substrate;
    wherein the switching layer resides on the substrate between the first electrical contact and the second electrical contact.

9. The electronic device of claim 1, wherein at least one of the first electrical contact and the second electrical contact comprises silicon;
   wherein the silicon is selected from the group consisting of single-crystalline silicon, amorphous silicon and poly-silicon.

10. The electronic device of claim 9, wherein the silicon further comprises at least one dopant.

11. The electronic device of claim 9, wherein the first electrical contact and the second electrical contact both comprise silicon.

12. The electronic device of claim 1, wherein at least one of the first electrical contact and the second electrical contact comprise a metal.

13. The electronic device of claim 12, wherein the metal is selected from the group consisting of platinum, titanium, tungsten, aluminum, copper and mixtures thereof.

14. The electronic device of claim 1, wherein the switchably conductive silicon oxide is produced from $SiO_2$ residing in the gap region.

15. The electronic device of claim 14, wherein the switchably conductive silicon oxide comprises defect-laden $SiO_2$;
   wherein the defects are introduced by a technique selected from the group consisting of wet-etching and dry-etching.

16. The electronic device of claim 1, wherein the switchably conductive silicon oxide is electrically treated by an electroforming process to form a switchably conductive pathway between the first electrical contact and the second electrical contact.

17. The electronic device of claim 1, wherein the switchably conductive silicon oxide is produced from $SiO_x$ residing in the gap region;
   wherein x is between 1 and 2.

18. The electronic device of claim 1, wherein the electronic device comprises a memory element comprising at least one ON state and at least one OFF state.

19. The electronic device of claim 18, wherein switching between the at least one ON state and the at least one OFF state occurs by a mechanism selected from the group consisting of unipolar switching and bipolar switching.

20. The electronic device of claim 18, wherein the electronic device has more than one ON state.

21. The electronic device of claim 18, wherein the electronic device has more than one OFF state.

22. The electronic device of claim 18, wherein an ON/OFF current ratio of the at least one ON state and the at least one OFF state is at least about $10^4$.

23. The electronic device of claim 18, wherein an ON/OFF current ratio of the at least one ON state and the at least one OFF state is between about 2 and about $10^6$.

24. The electronic device of claim 1, wherein the switching layer has a thickness between about 5 nm and about 1000 nm.

25. The electronic device of claim 24, wherein the switching layer has a thickness greater than about 40 nm.

26. The electronic device of claim 1, wherein the switching layer has at least one vertical edge extending between the first electrical contact and the second electrical contact.

27. The electronic device of claim 26, further comprising a conductive film bound to the at least one vertical edge.

28. A memory element comprising the electronic device of claim 1.

29. The memory element of claim 28, wherein the memory element comprises a memristor.

30. A radiation-hardened article of manufacture comprising the electronic device of claim 1.

31. An array comprising a plurality of the electronic devices of claim 1;
   wherein each of the plurality of electronic devices is independently electrically addressable.

32. The array of claim 31, wherein the array comprises a crossbar architecture of the plurality of electronic devices.

33. The array of claim 32, wherein a diode is placed in electrical conjunction with each of the plurality of electronic devices.

34. The array of claim 32, wherein the crossbar architecture further comprises a plurality of conductive wires connecting the plurality of electronic devices; and
   wherein a diode is embedded in the conductive wire between adjacent electronic devices.

* * * * *

UNITED STATES PATENT AND TRADEMARK OFFICE
CERTIFICATE OF CORRECTION

PATENT NO. : 8,592,791 B2  
APPLICATION NO. : 12/848626  
DATED : November 26, 2013  
INVENTOR(S) : James M. Tour et al.

Page 1 of 1

It is certified that error appears in the above-identified patent and that said Letters Patent is hereby corrected as shown below:

On the Title Page, Item -60- under Related U.S. Application Data, add "Provisional application No. 61/230,547, filed on July 31, 2009"

Signed and Sealed this  
Eighth Day of April, 2014

Michelle K. Lee  
*Deputy Director of the United States Patent and Trademark Office*